United States Patent
Jeon (10) Patent No.: US 8,344,927 B2
(45) Date of Patent: Jan. 1, 2013

(54) ANALOG DIGITAL CONVERTING DEVICE AND REFERENCE VOLTAGE CONTROLLING METHOD THEREOF

(75) Inventor: Young-deuk Jeon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 148 days.

(21) Appl. No.: 12/982,547

(22) Filed: Dec. 30, 2010

(65) Prior Publication Data

US 2012/0062400 A1    Mar. 15, 2012

(30) Foreign Application Priority Data

Sep. 15, 2010    (KR) .................. 10-2010-0090583

(51) Int. Cl.
*H03M 1/38* (2006.01)

(52) U.S. Cl. ........ 341/161; 327/307; 327/551; 327/534; 341/155; 341/160; 341/165; 341/159; 341/163

(58) Field of Classification Search .......... 341/140–165; 327/307, 551, 534
See application file for complete search history.

(56) References Cited

U.S. PATENT DOCUMENTS

| | | | |
|---|---|---|---|
| 7,397,412 B1* | 7/2008 | Cho | 341/161 |
| 7,541,962 B2* | 6/2009 | Sutardja | 341/161 |
| 7,880,660 B2* | 2/2011 | Sutardja | 341/161 |
| 7,924,204 B2* | 4/2011 | Chang et al. | 341/161 |
| 2009/0085790 A1 | 4/2009 | Lee | |
| 2010/0295714 A1* | 11/2010 | Johancsik et al. | 341/110 |
| 2012/0092200 A1* | 4/2012 | Das | 341/143 |

FOREIGN PATENT DOCUMENTS

| | | |
|---|---|---|
| KR | 1020040033630 A | 4/2004 |
| KR | 100446283 B1 | 8/2004 |
| WO | WO 2008/091603 A1 | 7/2008 |

OTHER PUBLICATIONS

Min Gyu Kim et al., "An 8mW 10b 50MS/s Pipelined ADC Using 25dB Opamp", IEEE Asian Solid-State Circuits Conference, Nov. 3-5, 2008, pp. 49-52, IEEE.

* cited by examiner

*Primary Examiner* — Lam T Mai (57) ABSTRACT

Provided are an analog digital converting device and a reference voltage controlling method thereof. The analog digital converting device includes: a first reference voltage generating circuit generating a first reference voltage; a second reference voltage generating circuit generating a second reference voltage; a first sub analog digital converter receiving an analog input signal and converting the analog input signal into a first digital signal by using the first reference voltage; an amplifier converting the first digital signal into a voltage corresponding to the first digital signal by using the first reference voltage and amplifying a difference between a voltage level of the analog input signal and a voltage level corresponding to the first digital signal to output a residual signal; and a second sub analog digital converter receiving the residual signal and converting the residual signal into a second digital signal by using the second reference voltage.

18 Claims, 9 Drawing Sheets

ANALOG DIGITAL CONVERTING DEVICE AND REFERENCE VOLTAGE CONTROLLING METHOD THEREOF

CROSS-REFERENCE TO RELATED APPLICATIONS

This U.S. non-provisional patent application claims priority under 35 U.S.C. §119 of Korean Patent Application No. 10-2010-0090583, filed on Sep. 15, 2010, the entire contents of which are hereby incorporated by reference.

BACKGROUND OF THE INVENTION

The present invention disclosed herein relates to a digital analog converting device, and more particularly, to a pipeline analog digital converting device.

Recently, as a mixed-mode system has been increasingly used, the necessity for an analog digital converter (ADC) tends to be gradually increased. Especially, researches for fabricating one chip through a complementary metal-oxide semiconductor (CMOS) process so as to achieve low manufacturing cost in a system such as a digital video disk player (DVDP) or a direct broadcasting for satellite receiver (DBSR) has been actively in progress. For this, design techniques of an ADC that processes a radio frequency signal (RF) directly stand out as the biggest issue.

A variety of types of ADCs have been suggested until now. A flash ADC, a pipeline ADC, and a successive approximation ADC are used in appropriate application fields depending on their respective characteristics. The flash ADC has a fast operating characteristic typically but its area is doubled each time the resolution is increased by one bit. The successive approximation ADC has low power consumption and simple circuit configuration but its operating frequency is limited. Among ADCs realized until now, while considering an area and power consumption in resolution of 10 bits and an operating frequency of more than 100 MHz, the pipeline ADC is regarded as the most suitable structure.

SUMMARY OF THE INVENTION

The present invention provides an analog digital converting device with an improved reliability by correcting an amplification error occurring in each stage of a pipeline ADC and a reference voltage controlling method thereof.

Embodiments of the present invention provide analog digital converting devices including: a first reference voltage generating circuit generating a first reference voltage; a second reference voltage generating circuit generating a second reference voltage; a first sub analog digital converter receiving an analog input signal and converting the analog input signal into a first digital signal by using the first reference voltage; an amplifier converting the first digital signal into a voltage corresponding to the first digital signal by using the first reference voltage and amplifying a difference between a voltage level of the analog input signal and a voltage level corresponding to the first digital signal to output a residual signal; and a second sub analog digital converter receiving the residual signal and converting the residual signal into a second digital signal by using the second reference voltage.

In some embodiments, the first and second digital signals may constitute a digital output signal into which the analog input signal is converted.

In other embodiments, the analog digital converting devices may further include a digital correction logic receiving the first and second digital signals, wherein the digital correction logic includes a memory storing a correction value and corrects errors of the first and second digital signals with reference to the correction value.

In still other embodiments, the second reference voltage generating circuit may include: a reference impedance device connected to first and second terminals; and an impedance unit connected to the first terminal and a third terminal to which a power voltage is applied, wherein a voltage of the first terminal, which is formed by adjusting an output impedance of the impedance unit, is provided as the second reference voltage.

In even other embodiments, the impedance unit may include a plurality of impedance devices connected in parallel between the first and third terminals; and the number of the plurality of impedance devices may vary.

In yet other embodiments, the impedance unit may include: a plurality of transistors connected in parallel between the first and third terminals; and a comparator receiving an initial reference voltage and outputting a voltage to gates of the transistors, the voltage amplified with a difference between a voltage level of the first terminal and a level of the initial reference voltage, wherein the number of the plurality of transistors varies.

In further embodiments, the second reference voltage generating circuit may further include a voltage generating circuit generating the initial reference voltage.

In still further embodiments, the second reference voltage generating circuit may include: a plurality of switch units connected to the third terminal; transistors connected to the first terminal and the plurality of switch units, respectively; and a comparator receiving an initial reference voltage and amplifying a difference between a voltage level of the first terminal and a level of the initial reference voltage to output it to gates of the transistors, wherein the number of transistors connected to the third terminal is determined according to switching operations of the plurality of switch units.

In even further embodiments, the first reference voltage generating circuit may generate the first reference voltage fixed.

In yet further embodiments, the sub analog digital converter may be a flash analog digital converter.

In other embodiments of the present invention, analog digital converting devices include: a first reference voltage generating circuit generating a first reference voltage; a second reference voltage generating circuit generating a second reference voltage; a first sub analog digital converter receiving an analog input signal and converting the analog input signal into a first digital signal by using the first reference voltage; an amplifier amplifying a difference between a voltage level of the analog input signal and a voltage level corresponding to the first digital signal to generate a residual voltage; and a second sub analog digital converter receiving the residual voltage and converting the residual voltage into a second digital signal by using the second reference voltage, wherein the second reference voltage generating circuit increases or decreases a level of the second reference voltage according to the second digital signal.

In some embodiments, the second reference voltage generating circuit may stop increasing or decreasing the level of the second reference voltage when a value of the second digital signal is changed.

In other embodiments, the first sub analog digital converter may receive an analog input signal having a fixed voltage level.

In still other embodiments, a level of the first reference voltage may correspond to a difference between levels of first and second voltages; and the first sub analog digital converter may receive the analog input signal corresponding to an intermediate value between the levels of the first and second voltages.

In still other embodiments of the present invention, reference voltage controlling methods of an analog digital converting device include: generating a first digital signal from an analog input signal by using a first reference voltage and amplifying a difference between a voltage of the analog input signal and a voltage level corresponding to the first digital signal to generate a residual signal; generating a second digital signal from the residual signal by using a second reference voltage and adjusting the second reference voltage according to the second digital signal; and generating a third digital signal from the residual signal by using the adjusted second reference voltage and determining the second reference voltage according to a comparison result of the second and third digital signals.

In some embodiments, the first reference voltage may correspond to a different between levels of a first voltage and a second voltage; and a voltage level of the analog input signal may have an intermediate value between a level of the first voltage and a level of the second voltage.

In other embodiments, the generating of the residual signal may include: generating a digital analog voltage from the first digital signal by using the first reference voltage; and generating the residual signal by amplifying a difference between a voltage level of the analog input signal and the digital analog voltage to have a predetermined amplification gain.

In still other embodiments, the adjusting of the second reference voltage may include increasing a level of the second reference voltage when the residual signal is amplified greater than the predetermined amplification gain according to a result with reference to the second digital signal.

In even other embodiments, the adjusting of the second reference voltage may include decreasing a level of the second reference voltage when the residual signal is amplified less than or equal to the predetermined amplification gain according to a result with reference to the second digital signal.

In yet other embodiments, the determining of the second reference voltage may include determining a level of the adjusted second reference voltage as a level of the second reference voltage when values of the second and third digital signals are different.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout.

It will also be understood that when a part is referred to as being 'connected to' another part, it can be directly connected to the another part, or intervening parts may also be present. In the entire specification, when a part "includes" a component, if there is no specific opposite statement, it means that the part may further include other components without excluding another component.

Figure 1:
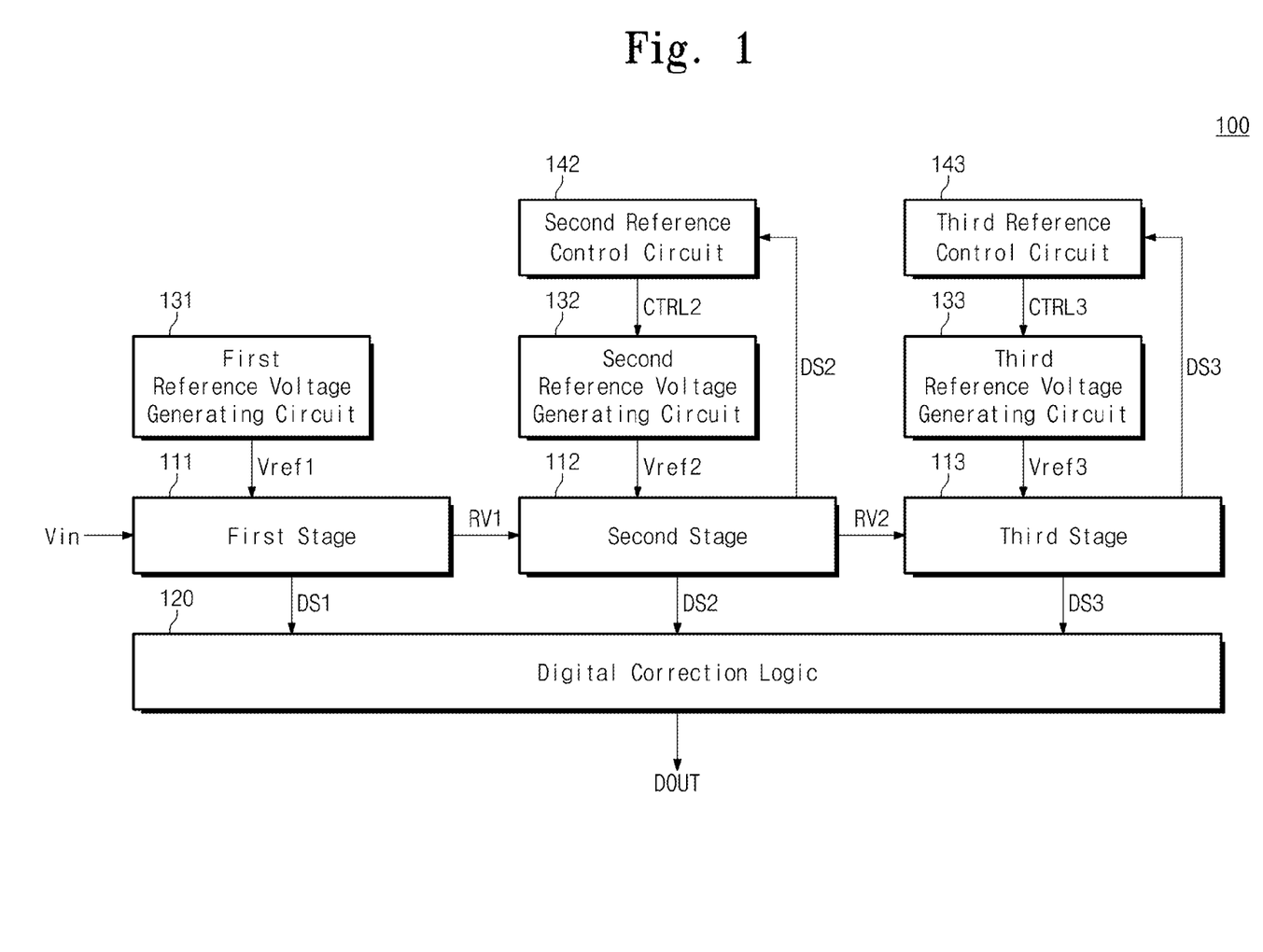
FIG. 1 is a block diagram illustrating a pipeline analog digital converter (ADC) 100 according to an embodiment of the present invention.

FIG. 1 is a block diagram illustrating a pipeline analog digital converter (ADC) 100 according to an embodiment of the present invention. Referring to FIG. 1, the pipeline ADC 100 includes first to third states 111 to 113, a digital correction logic 120, first to third reference voltage generating circuits 131 to 133, and second and third reference control circuits 142 and 143. As shown in FIG. 1, the ADC 100 includes three stages. However, this is just exemplary and thus, the pipeline ADC 100 may further include more than three stages.

The first stage 111 is connected to the second stage, the digital correction logic 120, and the first reference voltage generating circuit 131. The first stage 111 receives a first reference voltage Vref1 from the first reference voltage generating circuit 131. The first stage 111 converts an analog signal Vin into a first digital signal DS1 using the first reference voltage Vref1. The first stage 111 transmits the first digital signal DS1 to the digital correction logic 120.

The first stage 111 amplifies a difference between a voltage level corresponding to the first digital signal DS1 and a voltage level of the analog voltage Vin to generate a first residual voltage RV1. The generated first residual voltage RV1 is transmitted to the second stage 112.

The second stage 112 is connected to the first and third stages 111 and 113, the digital correction logic 120, the second reference voltage generating circuit 132, and the second reference control circuit 142. The second stage 112 receives a second reference voltage Vref2 from the second reference voltage generating circuit 132. Moreover, the second stage 112 converts the first residual voltage RV1 into a second digital signal DS2 using the second reference voltage Vref2. The second stage 112 converts the first residual voltage RV1 into a second digital signal DS2 using the second reference voltage Vref2. The second stage 112 transmits the converted second digital signal DS2 into the digital correction logic 120 and the second reference control circuit 142. Moreover, the second stage 112 amplifies a different between a voltage level corresponding to the second digital signal DS2 and the first residual voltage RV1 to generate a second residual voltage RV2. The second stage 112 transmits the generated second residual voltage RV2 to the third stage 113.

The third stage 113 converts the second residual voltage RV2 into a third digital signal DS3 using the third reference voltage Vref3 received from the third reference voltage generating circuit 133. The third stage 113 transmits the converted third digital signal DS3 into the digital correction logic 120 and the third reference control circuit 143. As shown in FIG. 1, if the pipeline ADC 100 includes three stages, the last third stage 113 does not generate residual voltage. In this case, the third stage 113 does not include an additional means for amplifying a difference between a voltage level corresponding to the third digital signal DS3 and the second residual voltage RV2.

The digital correction logic 120 receives the first to third digital signals DS1 to DS3 from the first to third stages 111 to 113. The digital correction logic 120 corrects digital errors of the received first to third digital signals DS1 to DS3. The digital correction logic 120 generates a digital output signal DOUT by correcting the digital errors. That is, the first to third digital signals DS1 to DS3 may include errors and the digital correction logic 120 generates a digital output signal DOUT without an error.

Exemplarily, the digital correction logic 120 includes a memory (not shown) storing a correction value and corrects digital errors of the first to third digital signals DS1 to DS3 with reference to the correction value stored in the memory. Exemplarily, each of the first to third digital signals DS1 to DS3 may consist of 5 bits. Moreover, the digital correction logic 120 corrects digital errors of the first to third digital signals DS1 to DS3 and outputs a digital output signal DOUT consisting of 10 bits.

The first to third reference voltage generating circuits 131 to 133 generate the first to third reference voltages Vref1 to Vref3. Although not shown in FIG. 1, the first to third reference voltage generating circuits 131 to 133 receive power voltage (not shown) and generate the first to third reference voltages Vref1 and Vref2 based on the received power voltage.

The first reference voltage generating circuit 131 generates a fixed first reference voltage Vref1. The second reference voltage generating circuit 132 is connected to the second reference control circuit 142. The second reference voltage generating circuit 132 receives a second control signal CTRL2 received from the second reference control circuit 142. The second reference voltage generating circuit 132 adjusts a level of the second reference voltage Vref2 in response to the second control signal CTRL2. In the same manner, the third reference voltage generating circuit 133 adjusts a level of the third reference voltage Vref3 in response to the third control signal CTRL3.

The second reference control circuit 142 is connected to the second stage 112 and the reference voltage generating circuit 132. The second reference control circuit 142 receives the second digital signal DS2 from the second stage 112. Furthermore, the second reference control circuit 142 generates the second control signal CTRL2 with reference to the second digital signal DS2.

The third reference control circuit 143 is configured identical to the second reference control circuit 142. The third reference control circuit 143 outputs a third control signal CTRL3 with reference to the third digital signal received from the third stage 113.

According to an embodiment of the present invention, respectively different reference voltages are provided to the first to third stages 111 to 113. According to an embodiment of the present invention, the second and third reference voltages Vref2 and Vref3 are adjusted to compensate for an amplification error of each of the first and second stages 111 and 112. Specifically, the second reference voltage Vref2 provided to the second stage 112 is changed in consideration of an amplification error in the first stage 111. Likewise, the third reference voltage Vref3 provided to the third stage 113 is changed in consideration of an amplification error in the second stage 112.

Figure 2:
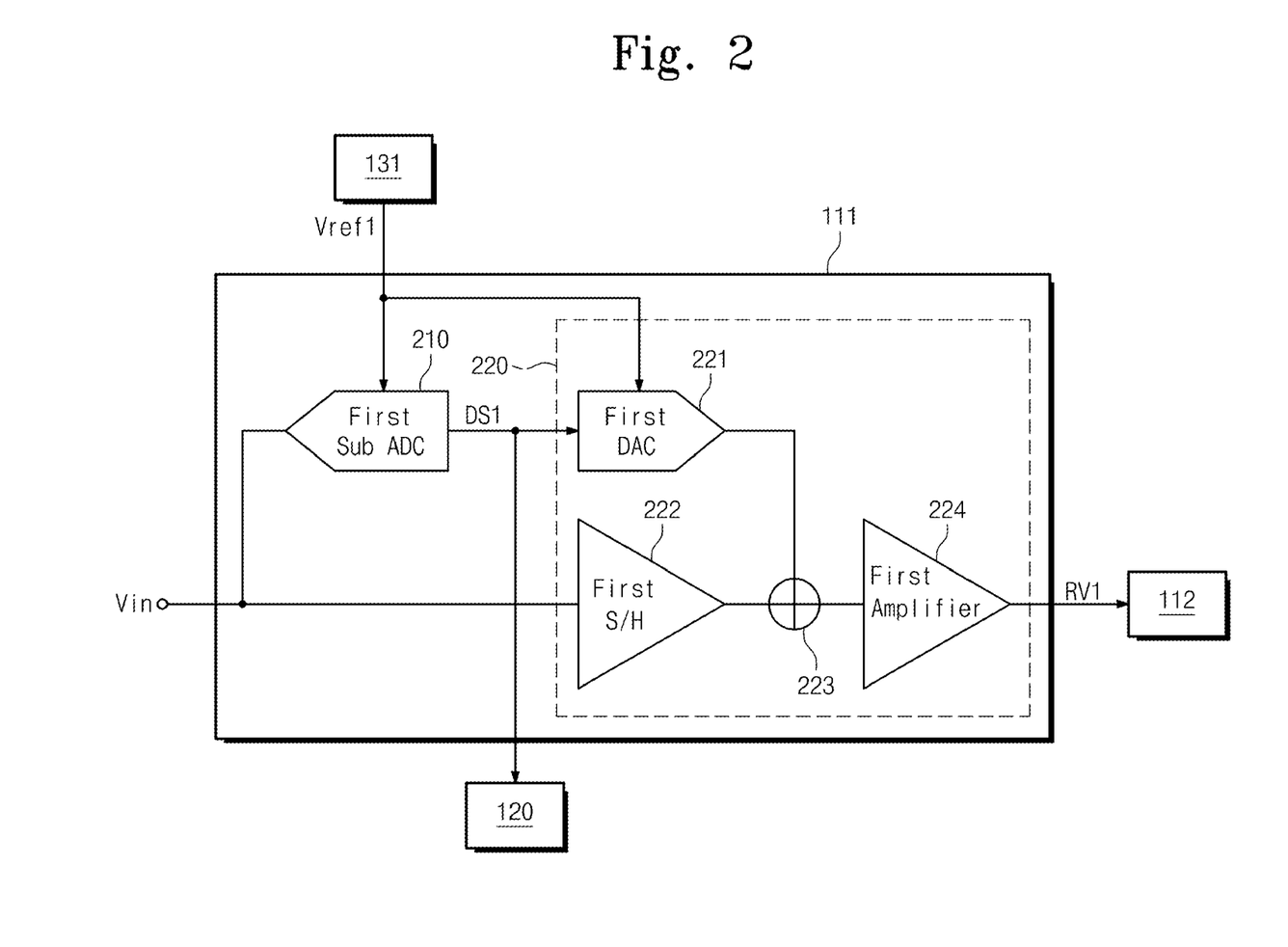
FIG. 2 is a block diagram illustrating the first stage 111 of FIG. 1.

FIG. 2 is a block diagram illustrating the first stage 111 of FIG. 1. Referring to FIG. 2, the first stage 111 includes a first sub ADC 210 and a first multiplying digital to analog converter (MDAC) 220.

The first sub ADC 210 receives an analog voltage Vin and a first reference voltage Verf1. The first sub ADC 210 converts an analog voltage Vin to a first digital signal DS1 using a first reference voltage Vref1. The converted first digital signal DS1 is transmitted to the first MDAC 220 and the digital correction logic 120.

The first MDAC 220 includes a first digital to analog converter (DAC), a first sample and holder 222, a first adder 223, and a first amplifier 224. The first DAC 221 receives a first digital signal DS1 from the first sub ADC 210. The first DAC 221 receives a first reference voltage Vref1 from the first reference voltage generating circuit 131. The first DAC 221 converts the first digital signal DS1 to a digital analog voltage using the first reference voltage Vref1. That is, the first DAC 221 outputs a digital analog voltage corresponding to the first digital signal DS1.

The first sample and holder 222 receives an analog signal Vin. The first sample and holder 222 delays the analog signal Vin by the processing time of the first DAC 221. The first adder 223 outputs a difference between a level of the analog voltage received from the first sample and holder 222 and an analog voltage level received from the first DAC 221. The first amplifier 224 outputs a first residual voltage RV1 by amplifying a voltage received from the first adder 223.

Figure 3:
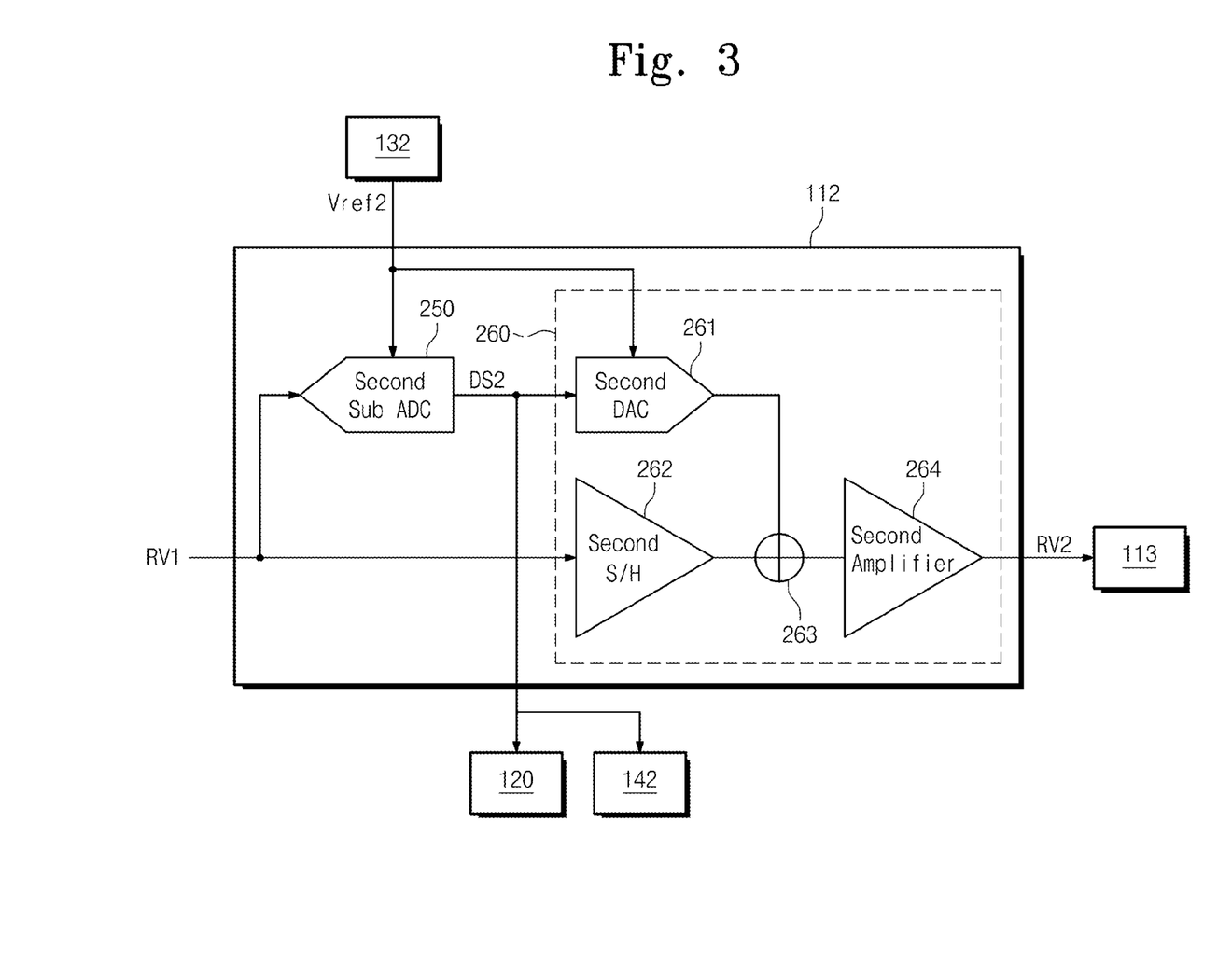
FIG. 3 is a block diagram illustrating the second stage 112 receiving the first residual voltage RV1 of FIG. 2.

FIG. 3 is a block diagram illustrating the second stage 112 receiving the first residual voltage RV1 of FIG. 2. Referring to FIG. 3, the second stage 112 includes a second sub ADC 250 and a second MDAC 260.

Except that the second digital signal DS2 is additionally transmitted to the second reference control circuit 142, the second stage 112 has the same configuration as the first stage 111.

The second sub ADC 250 converts the first residual voltage RV1 into a second digital signal DS2 using the second reference voltage Vref2. Moreover, the second digital signal DS2 is transmitted to the digital correction logic 120 and the second reference control circuit 142.

The second MDAC 260 amplifies a difference between the first residual voltage RV1 and a voltage level corresponding to the second digital signal DS2 to generate a second residual voltage RV2. The generated second residual voltage RV2 is transmitted to the third stage 113 of FIG. 1.

Figure 4:
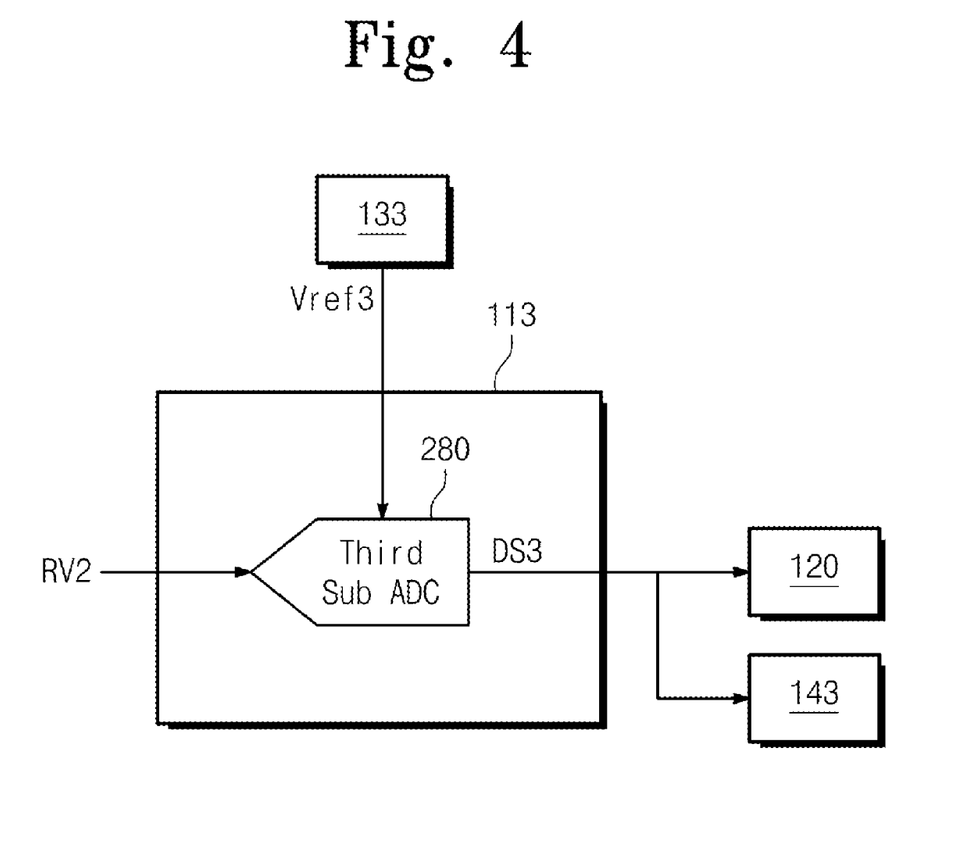
FIG. 4 is a block diagram illustrating the second stage 113 receiving the second residual voltage RV2 of FIG. 3.

FIG. 4 is a block diagram illustrating the second stage 113 receiving the second residual voltage RV2 of FIG. 3. Referring to FIG. 4, the third stage 113 includes a third sub ADC 280. The third stage 113 does not include an MDAC since it does not generate residual voltage.

The third sub ADC 280 receives a second residual voltage RV2 and a third reference voltage Vref3. Moreover, the third sub ADC 280 converts the second residual voltage RV2 into a third digital signal DS3 using the third reference voltage Vref3. The converted digital signal DS3 is transmitted to the digital correction logic 120 and the third reference control circuit 143.

The first to third sub ADCs 210, 250, and 280 may be a flash ADC. For example, the first sub ADC 210 generates reference voltages (not shown) using a plurality of resistance devices (not shown) connected in series. Moreover, after comparing the generated reference voltages with an analog voltage Vin, a first digital signal DS1 may be outputted.

Figure 5:
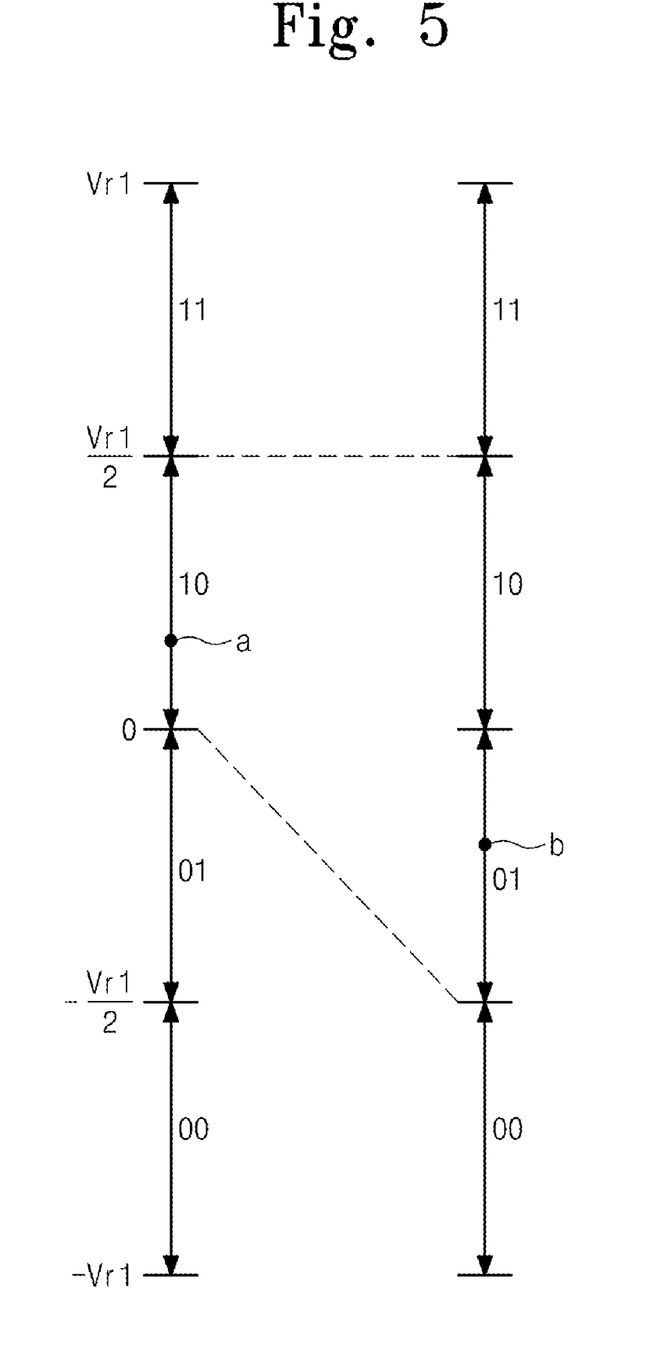
FIG. 5 illustrates an amplification gain of the first amplifier 224 of FIG. 2.

FIG. 5 illustrates an amplification gain of the first amplifier 224 of FIG. 2. In FIG. 5, a horizontal direction represents a size of a voltage level. Referring to FIGS. 2 and 5, a level a of an analog voltage Vin is converted into a first digital signal DS1 based on the first reference voltage Vref1. At this point, the first reference voltage Vref1 corresponds to a difference between a level of a positive reference voltage Vr1 and a level of a negative reference voltage −Vr1.

In FIG. 5, it is shown that an analog voltage Vin is converted into a first digital signal DS1 of 2 bits. The first stage 111 outputs the first digital signal DS1 of a logic value "10" according to the level a of the analog voltage Vin.

The first MDAC 220 of the first stage 111 amplifies a difference between the analog voltage Vin and a voltage level corresponding to the first digital signal DS1 to generate a first residual voltage RV1. Exemplarily, the first residual voltage RV1 is expressed as the following Equation 1.

$$RV1 = 2^{N-1} \cdot (Vin - D) \quad \text{[Equation 1]}$$

Referring to Equation 1, D represents a voltage level corresponding to the first digital signal DS1. N represents resolution of the first digital signal DS1. According to Equation 1, the first adder 223 outputs a voltage level corresponding to Vin−D. Moreover, an amplification gain of the first amplifier 224 is $2^{N-1}$. According to Equation 1, regardless of whether the analog voltage Vin has a voltage level corresponding to a certain logic value, the first residual voltage RV1 may have a voltage level corresponding to one of logic values "10" and "01".

For example, it is assumed that a level of the first reference voltage Vref1 is 12. That is, it is assumed that levels of the positive reference voltage Vr1 and negative reference voltage −Vr1 are 6 and −6, respectively. Moreover, it is assumed that the level a of an analog voltage Vin is 1. As shown in FIG. 5, since the first digital signal DS1 represents 2 bits, N is 2. A difference between the level a of an analog voltage Vin and 1.5 (i.e., a voltage of a digital analog voltage corresponding to the logic value "10") is −0.5. Furthermore, if 0.5 is doubled, −1 is calculated. Accordingly, the level b of the first residual voltage RV1 is −1.

Moreover, an amplification error occurs in the first amplifier 224. That is, when an amplification gain of the first amplifier 224 is less than or greater than a required amplification gain, amplification errors occur.

When an amplification gain of the first amplifier 224 is greater than a required amplification gain, the level b of the first residual voltage RV1 shown in FIG. 5 may be lowered. At this point, if the level of the second reference voltage Vref2 is increased, the second digital signal DS2 with improved reliability may be provided. If the level of the second reference voltage Vref2 is fixed like the first reference voltage Vref1, a logic value corresponding to the first residual voltage RV1 may be determined as "00" in the second stage.

When an amplification gain of the first amplifier 224 is less than a required amplification gain, the level b of the first residual voltage RV1 shown in FIG. 5 may be raised. At this point, as a level of the second reference voltage Vref2 is reduced, the second digital signal DS2 of FIG. 3 with improved reliability may be provided.

Figure 6:
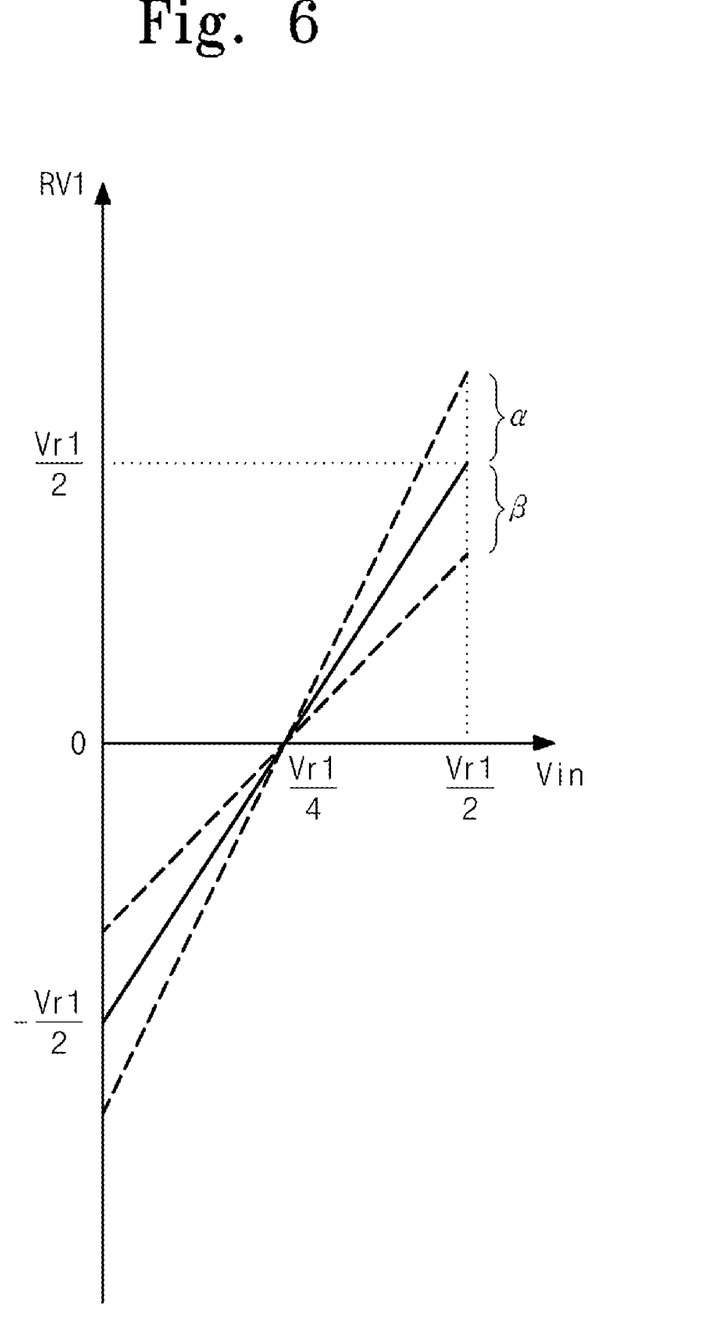
FIG. 6 is a graph illustrating a relationship between the analog voltage Vin and the first residual voltage RV1 of FIG. 2.

FIG. 6 is a graph illustrating a relationship between the analog voltage Vin and the first residual voltage RV1 of FIG. 2. Referring to FIG. 6, the horizontal axis represents a level of an analog voltage Vin. Moreover, a vertical axis represents a level of a first residual voltage RV1. In FIG. 6, only a voltage level is exemplarily shown when the analog voltage Vin corresponds to the logic value "10".

As the level of an analog voltage Vin is increased, the level of the first residual voltage RV1 is increased also. The first residual voltage RV1 may be mapped into a voltage range corresponding to a logic value "10" or "01". Although not shown in FIG. 6, when the analog voltage Vin have a voltage level corresponding to the logic values "00", "01", or "11", the first residual voltage RV1 may be mapped into a voltage range corresponding to the logic value "10" or "01".

If the first amplifier 224 of FIG. 2 has a greater amplification gain than a required amplification gain, a first amplification error α may occur. If the first amplifier 224 of FIG. 2 has a less amplification gain than a required amplification gain, a second amplification error β may occur. Likewise, an amplification error may occur in the second amplifier 264.

In the first amplifier 224 of FIG. 2, if the first amplification error α or the second amplification error β occurs, a digital error rate of the second stage 112 receiving the first residual voltage RV1 may be increased. Here, the first amplification error α represents a case that an amplification gain of the first amplifier 224 is greater than a required amplification gain. The second amplification error β represents a case that an amplification gain of the first amplifier 224 is less than a required amplification gain. That is, according to an amplification error of the first MDAC 220, a level of the first residual voltage RV1 is changed.

According to an embodiment of the present invention, by adjusting a reference voltage when an amplification error occurs in each MDAC of the first and second stages 111 and 112, the pipeline ADC 100 with improved reliability is provided.

Figure 7:
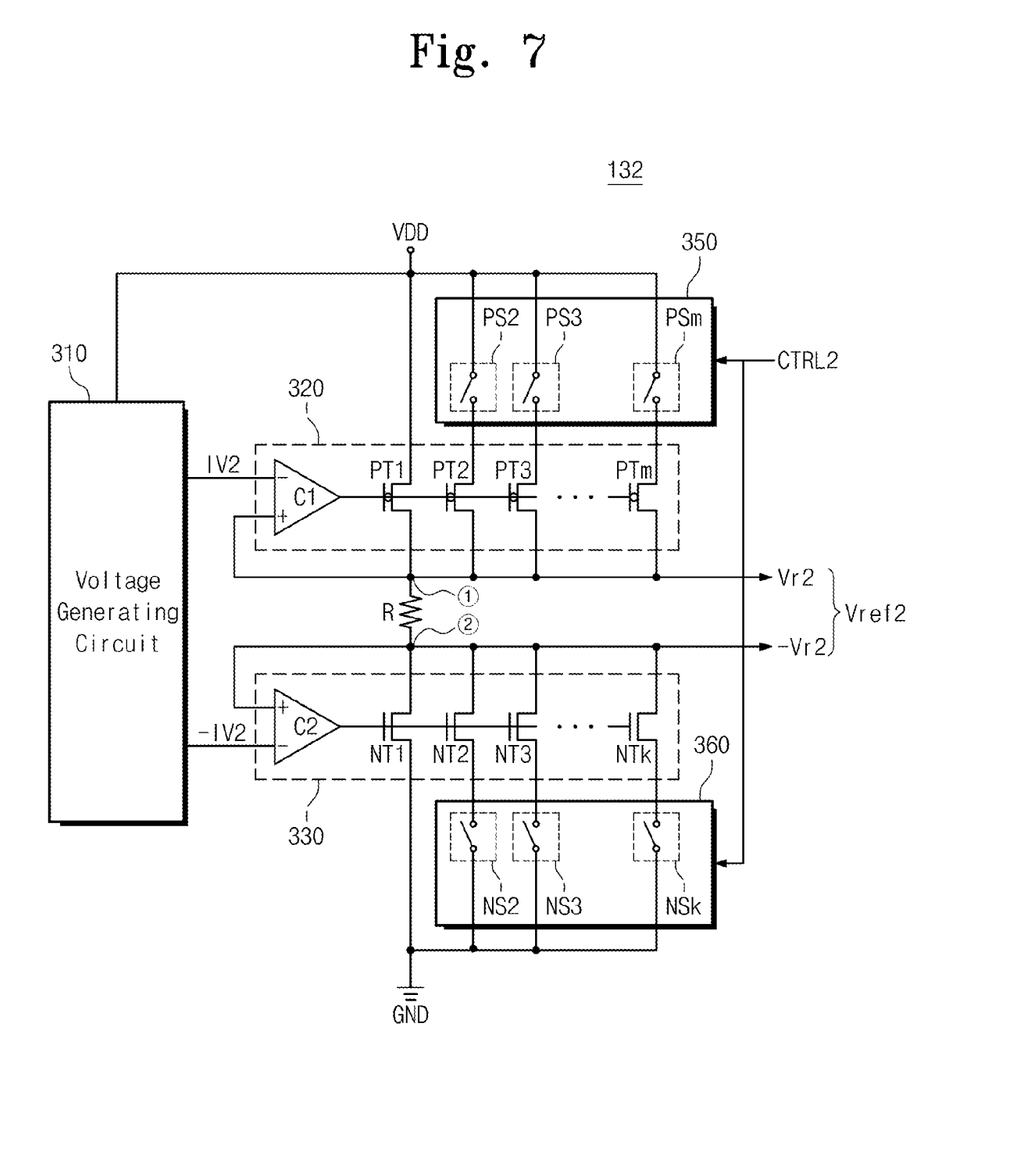
FIG. 7 is a block diagram illustrating the second reference voltage generating circuit 132 of FIG. 1.

FIG. 7 is a block diagram illustrating the second reference voltage generating circuit 132 of FIG. 1. Hereinafter, although the second reference voltage generating circuit 132 is described with reference to FIG. 7, the third reference voltage generating circuit 133 has the same configuration as it.

Referring to FIG. 7, the second reference voltage generating circuit 132 includes a voltage generating circuit 310, first and second impedance adjusting units 320 and 330, a power switch unit 350, a ground switch unit 360, and a reference resistor R.

The voltage generating circuit 310 is connected to first and second comparators C1 and C2. Moreover, the voltage generating circuit 310 receives a power voltage VDD. The voltage generating circuit 310 generates a positive initial reference voltage IV2 and a negative initial reference voltage −IV2 using the power voltage VDD.

The first impedance adjusting unit 320 includes the first comparator C1 and first to m P-type transistors PT1 to PTm.

The first comparator C1 is connected to the voltage generating circuit 310, a first terminal ①, and the first to m P-type transistors PT1 to PTm. The first comparator C1 may provide a voltage (that amplifies a difference between a voltage level of the first terminal ① and a level of the positive initial reference voltage IV2) to the first to m P-type transistors PT1 to PTm.

The first to m P-type transistors PT1 to PTm are connected in parallel. The first P-type transistor PT1 receives a power voltage VDD. Moreover, the first P-type transistor PT1 is connected to the first terminal ①. The second to m P-type transistors PT2 to PTm are connected to the power switch unit 350 and the first terminal ①.

The second impedance adjusting unit 330 includes a second comparator C2 and first to k N-type transistors NT1 to NTk. The second comparator C1 is connected to the voltage generating circuit 310, a second terminal ②, and the k N-type transistors NT1 to NTk. The second comparator C2 may provide a voltage (that amplifies a difference between a voltage level of the second terminal ② and a level of the negative initial reference voltage −IV2) to the first to k N-type transistors NT1 to NTk.

The first to k N-type transistors NT1 to NTk are connected in parallel. The first N-type transistor NT1 receives ground voltage GND. Moreover, the first N-type transistor NT1 is connected to the second terminal ②. The first to k N-type transistors NT1 to NTk are connected to the ground switch unit 360 and the second terminal ②. In addition, the reference resistor R is connected between the first terminal ① and the second terminal ②.

The power switch unit 350 includes second to m power switches PS2 to PSm. Moreover, the ground switch unit 360 includes second to k ground switches NS2 to NSk.

The power switch unit 350 is connected to the second to m P-type transistors PT2 to PTm. Moreover, the ground switch unit 360 is connected to the second to k N-type transistors NT2 to NTk.

In order for allowing the power voltage VDD to be provided to the second to m P-type transistors PT2 to PTm, the power switch unit 350 switches in response to the second control signal CTRL2. Moreover, in response to the second control signal CTRL2, the ground switch unit 360 connects the second to k N-type transistors NT2 to NTk with the ground voltage GND. That is, in response to the second control signal CTRL2, the second to m power switches PS2 to PSm and the second to k ground switches NS to NSn may switch.

The power and ground switch units 350 and 360 adjust output impedances of the first and second impedance adjusting units 320 and 330 in response to the second control signal CTRL2. Once the output impedances of the first and second impedance adjusting units 320 and 330 are adjusted, voltages of the first and second terminals ① and ②.

A voltage of the first terminal ① is provided as a positive reference voltage Vr2 to the second stage 112. A voltage of the second terminal ② is provided as a negative reference voltage −Vr2 to the second stage 112. The second reference voltage Vref2 of FIG. 1 corresponds to a difference between the positive reference voltage Vr2 and the negative reference voltage −Vr2. That is, once output impedances of the first and second impedance adjusting units 320 and 330 are adjusted, the second reference voltage Vref2 may be changed.

It is assumed that all the switches PS2 to PSm and NS2 to NSk are turned off. At this point, gate voltages of the first P-type transistor PT1 and the first N-type transistor NT1 are respectively determined by output voltages of the first and second comparators C1 and C2. Moreover, a current flowing through the first P-type transistor PT1 and the first N-type transistor NT1 is determined by the reference resistor R. Once the second power switch PS2 and the second ground switch NS2 are turned on, a current flowing through the first P-type transistor PT1 may be reduced. Likewise, a current flowing through the first N-type transistor NT1 may be reduced. Since the first P-type transistor PT1 has finite output impedance, as the current flowing through the first P-type transistor PT1 is reduced, a voltage between the drain and source of the first P-type transistor PT1 may be reduced also. Likewise, a voltage between the drain and source of the first N-type transistor NT1 may be reduced. Accordingly, a voltage difference between the first and second terminals ① and ② may be increased. That is, a level of the second reference voltage Vref2 may be increased.

As a result, as the number of turn-on switches among the second to m power switches PS2 to PSm is increased, a voltage between the drain and source of the first P-type transistor PT1 may be reduced. Moreover, as the number of turn-on switches among the second to k ground switches NS2 to NSk is increased, a voltage between the drain and source of the first N-type transistor NT1 may be reduced. Accordingly, a level of the second reference voltage Vref2 may be adjusted.

Exemplarily, while all the switches PS2 to PSm and NS2 to NSk are turned off, if the second power switch PS2 and the second ground switch NS2 begin to tune on sequentially, a level of the second reference voltage Vref2 may be increased. Exemplarily, while all the switches PS2 to PSm and NS2 to NSk are turned on, if the m power switch PSm and the k ground switch NSk begin to tune off sequentially, a level of the second reference voltage Vref2 may be reduced.

The technical ideas of the present invention are not limited to a case that the second reference voltage Vref2 corresponds to a difference between a positive reference voltage and a negative reference voltage. For example, when the second reference voltage Vref2 corresponds to a difference between a positive reference voltage and a ground voltage, the second reference voltage generating circuit 132 includes a voltage generating circuit 310, a first impedance adjusting unit 320, a power switch unit 350, and a reference resistor R. moreover, ground voltage may be provided to the second terminal ②. At this point, according to a switching operation of the power switch unit 350, impedance of the first impedance adjusting unit 320 may be adjusted. Moreover, a voltage of the first terminal CD may be provided as a positive reference voltage.

In the description with reference to FIG. 7, the second reference voltage generating circuit 132 varying a second reference voltage Vref2 with the plurality of transistors PT1 to PTm and NT1 to NTk is used. However, the embodiments of the present invention are not limited to the description with reference to FIG. 7. For example, the first and second impedance adjusting units 320 and 330 include a plurality of impedance devices and the second reference voltage Vref2 may vary by adjusting the number of a plurality of impedance devices connected in parallel.

Figure 8:
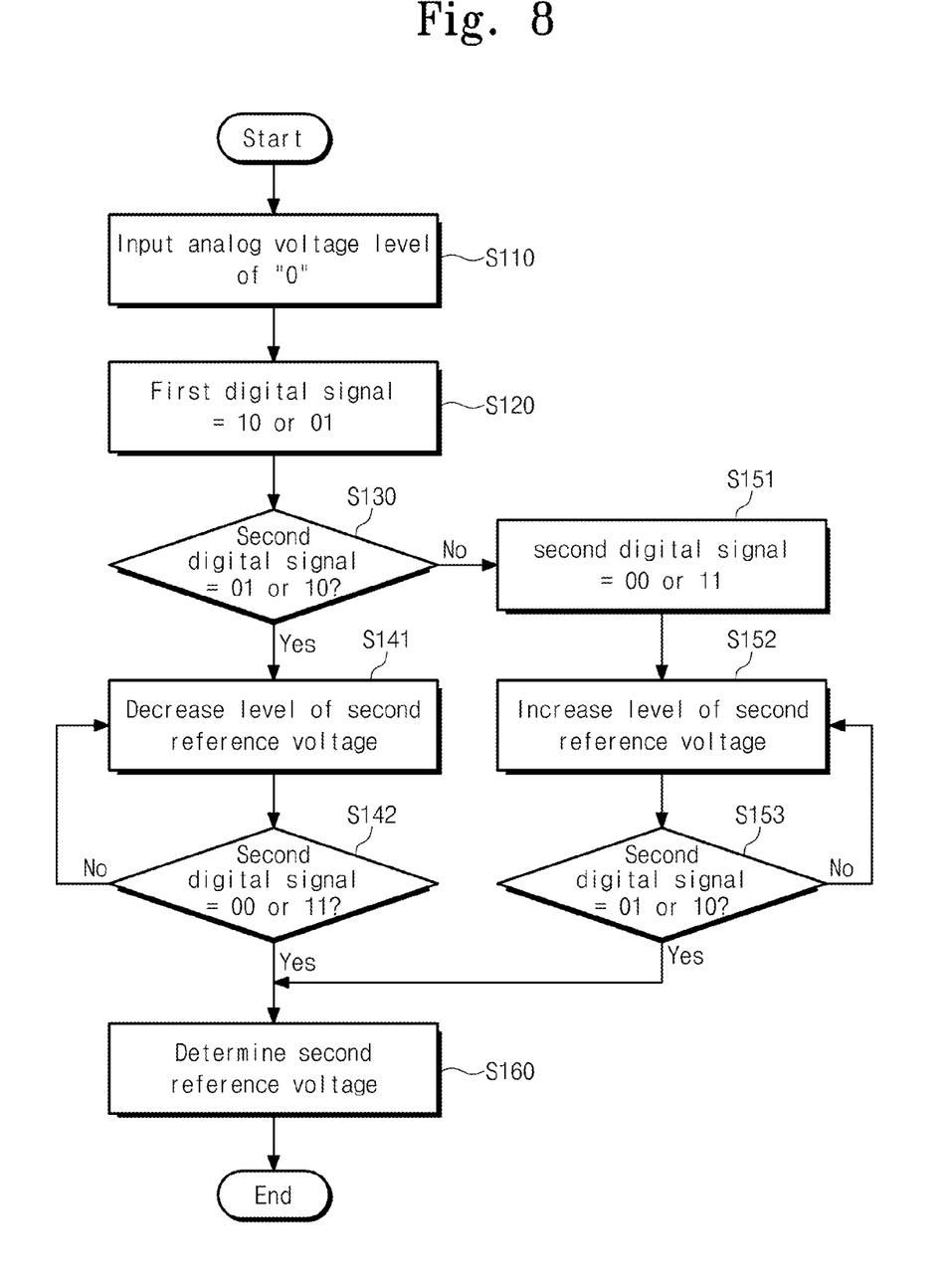
FIG. 8 is a flowchart illustrating a reference voltage controlling method in the pipeline ADC 100 of FIG. 1.

FIG. 8 is a flowchart illustrating a reference voltage controlling method in the pipeline ADC 100 of FIG. 1. In the description with reference to FIG. 8, it is assumed that the first and second digital signals DS1 and DS2 have one of logic values "00", "01", "10", and "11" as shown in FIG. 5.

Referring to FIGS. 1, 7, and 8, in operation S110, an analog voltage Vin having a voltage level of 0 is inputted to the first stage 111. That is, an analog voltage V1 corresponding to an intermediate value of a level of the first reference voltage Vref1 is inputted.

In operation S120, the first stage 111 determines a logic value of the first digital signal DS1 as "10" or "01". Then, the first stage 111 amplifies a difference between a level of the inputted analog voltage Vin and a voltage level corresponding to the logic value of the first digital signal DS1 to output a first residual voltage RV1.

In operation S130, it is determined whether the second digital signal DS2 is a logic value of "01" or "10".

The second sub ADC 250 of FIG. 3 of the second stage 112 converts the first residual voltage RV1 into the second digital signal DS2 using a second reference voltage Vref2. The converted second digital signal DS2 is transmitted to the digital correction logic 120 and the second reference control circuit 142.

If a logic value of the first digital signal DS1 is "10", a logic value of the second digital signal DS2 may be "01". That is, if the logic value of the first digital signal DS1 is determined as "10", 0 (i.e., a level of the analog voltage Vin) may correspond to the smallest voltage level among voltage levels corresponding to the logic value of "10". Accordingly, if the first residual voltage RV1 is mapped into a voltage range corresponding to the logic values "10" and "01", the logic value of the second digital signal DS2 may be "01" corresponding to a smaller voltage level among the logic values "10" and "01". Likewise, if a logic value of the first digital signal DS1 is "01", a logic value of the second digital signal DS2 may be "10". That is, if it is determined that a logic value of the first digital signal DS1 is "01", 0 (i.e., a level of the analog voltage Vin) may correspond to the largest one among voltage levels corresponding to the logic value "10". Accordingly, a logic value of the second digital signal DS2 is "10".

Moreover, if a logic value of the first digital signal DS1 is "10", a logic value of the second digital signal DS2 may be "00". When a logic value of the first digital signal DS1 is "01", a logic value of the second digital signal DS2 may be "11". If the second digital signal DS2 is a logic value "00" or "11", it corresponds to a case that an amplification gain of the first MDAC 220 of FIG. 2 is greater than a required amplification gain.

If the second digital signal DS2 is a logic value of "01" or "10", it corresponds to a case that an amplification gain of the first MDAC 220 of FIG. 2 is less than a required amplification gain.

If a logic value of the second digital signal DS2 is "01" or "10", operation S141 is performed. Then, if a logic value of the second digital signal DS2 is not "01" or "10", operation S152 is performed.

In operation S141, a level of the second reference voltage Vref2 is reduced. If the second digital signal having a logic value of "01" or "10" is reduced, the second reference control circuit 142 transmits a second control signal CTRL2. In response to the second control signal CTRL2, the number of turned-on power switches in the power switch unit 350 may be reduced. Moreover, the number of turned-on ground switches in the ground switch unit 360 may be reduced.

That is, according to an embodiment of the present invention, by referring to the second digital signal DS2, when the first residual voltage RV1 is amplified less than or equal to a predetermined amplification gain, a level of the second reference voltage Vref2 is reduced.

Exemplarily, one power switch may be turned off among turned-on power switches in the power switch unit 350. Moreover, one ground switch may be turned off among turned-on ground switches in the ground switch unit 360.

In operation S142, with a changed level of the second reference voltage Vref2, it is determined whether a logic value of the second digital signal DS2 is "00" or "11". That is, the second sub ADC 250 of FIG. 3 generates the second digital signal DS2 using the second reference voltage Vref2 corresponding to a changed voltage level. The second reference control circuit 142 receives the second digital signal DS2. Then, the second reference control circuit 142 determines whether a logic value of the second digital signal DS2 is "00" or "11".

If a logic value of the second digital signal DS2 is still "01" or "10", operation S141 is performed again. In response to the second control signal CTRL2 received from the second reference control circuit 142, the number of turned-on switches of the power and ground switch units 350 and 360 may be reduced.

If a logic value of the second digital signal DS2 is "00" or "11", a level of the second reference voltage Vref2 is determined as a changed voltage level in operation S160. For example, if the second reference control circuit 142 receives the second digital signal DS2 having a logic value of "00" or "11", it does not generate the second control signal CTRL2.

If a logic value of the second digital signal DS2 is not "01" or "10", a logic value of the second digital signal DS may be "00" or "11" in operation S151. In this case, operation S152 is performed. In operation S152, a level of the second reference voltage Vref2 is increased. That is, by referring to the second digital signal DS2, when the first residual voltage RV1 is amplified greater than a predetermined amplification gain, a level of the second reference voltage Vref2 is increased.

The second reference control circuit 142 receiving the second digital signal DS2 having a logic value of "00" or "11" generates the second control signal CTRL2. In response to the second control signal CTRL2, the number of turned-on power switches in the power switch unit 350 may be increased. Moreover, in response to the second control signal CTRL2, the number of turned-on ground switches in the ground switch unit 360 may be increased.

In operation S153, with an increased level of the second reference voltage Vref2, it is determined whether a logic value of the second digital signal DS2 is "01" or "10". If a logic value of the second digital signal DS2 is not "01" or "10", operation S152 is performed again. In response to the second control signal CTRL2 received from the second reference control circuit 142, the number of tuned-on switches of the power and ground switch units 350 and 360 may be increased. If a logic value of the second digital signal DS2 is "01" or "10", a level of the second reference voltage Vref2 is determined as an increased voltage level in operation S160.

An operating method of the pipeline ADC 100 according to an embodiment of the present invention sense an amplification error of the MDAC 220 in the first stage 111 by referring to the second digital signal DS2. Additionally, if the amplification error is sensed, a level of the reference voltage compared to a residual voltage is increased or decreased. Accordingly, an operating method of the pipeline ADC 100 with improved reliability is provided.

Figure 9:
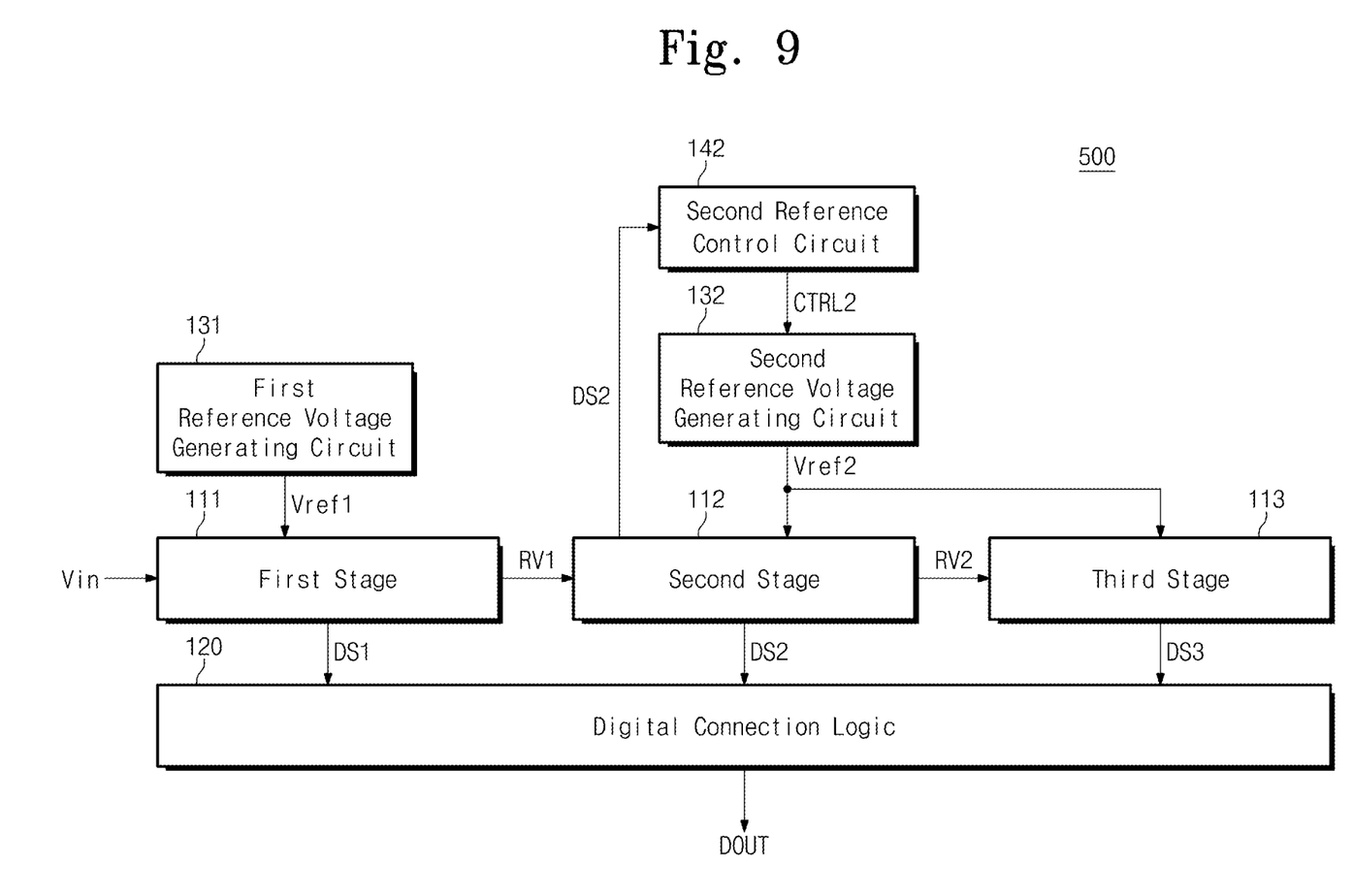
FIG. 9 is a block diagram illustrating a pipeline ADC 500 according to another embodiment of the present invention.

FIG. 9 is a block diagram illustrating a pipeline ADC 500 according to another embodiment of the present invention. Referring to FIG. 9, except that the pipeline ADC 500 does not include the third reference voltage generating circuit 133 and the third reference control circuit 143, the pipeline ADC 500 has the same configuration as the pipeline ADC 100 of FIG. 1.

In relation to the pipeline ADC 500 according to an embodiment of the present invention, the first to third stages 111 to 113 are divided into a plurality of groups and respectively different reference voltages are provided to the plurality of groups. In FIG. 9, the first stage 111 receives a first reference voltage Vref1 and the second and third stages 112 and 113 receive a second reference voltage Vref2. Moreover, the second reference voltage Vref2 may be adjusted according to an amplification error of the first MDAC 220 in the first stage 111.

According to an embodiment of the present invention, the pipeline ADC including a plurality of stages uses a plurality of reference voltages. Moreover, if an amplification error occurs in the MDACs in each of the plurality of stages, reference voltages are adjusted, so that a pipeline ADC with improved reliability is provided.

According to embodiments of the present invention, respectively different reference voltages are provided first and second sub analog digital converting device. The provided reference voltages may vary if an amplification gain of a residual signal is changed. Accordingly, provided are an analog digital converting device with improved reliability and a reference voltage controlling method thereof.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An analog digital converting device comprising:
a first reference voltage generating circuit generating a first reference voltage;
a second reference voltage generating circuit generating a second reference voltage;
a first sub analog digital converter receiving an analog input signal and converting the analog input signal into a first digital signal by using the first reference voltage;
an amplifier converting the first digital signal into a voltage corresponding to the first digital signal by using the first reference voltage and amplifying a difference between a voltage level of the analog input signal and a level of the voltage corresponding to the first digital signal to output a residual signal; and
a second sub analog digital converter receiving the residual signal and converting the residual signal into a second digital signal by using the second reference voltage,
wherein a level of the second reference voltage is increased or decreased according to a level of the second digital signal, the level of the second digital signal corresponding to an amplification gain of the amplifier with respect to a predetermined value.

2. The analog digital converting device of claim 1, wherein the first and second digital signals constitute a digital output signal into which the analog input signal is converted, and
wherein the level of the second reference voltage is increased if the amplification gain is greater than the predetermined value or decreased if the amplification gain is less than the predetermined value.

3. The analog digital converting device of claim 1, further comprising a digital correction logic receiving the first and second digital signals,
wherein the digital correction logic includes a memory storing a correction value and corrects errors of the first and second digital signals with reference to the correction value.

4. The analog digital converting device of claim 1, wherein the first reference voltage generating circuit generates the first reference voltage fixed.

5. The analog digital converting device of claim 1, wherein the sub analog digital converter is a flash analog digital converter.

6. An analog digital converting device comprising:
a first reference voltage generating circuit generating a first reference voltage;
a second reference voltage generating circuit generating a second reference voltage;
a first sub analog digital converter receiving an analog input signal and converting the analog input signal into a first digital signal by using the first reference voltage;
an amplifier converting the first digital signal into a voltage corresponding to the first digital signal by using the first reference voltage and amplifying a difference between a voltage level of the analog input signal and a level of the voltage corresponding to the first digital signal to output a residual signal; and
a second sub analog digital converter receiving the residual signal and converting the residual signal into a second digital signal by using the second reference voltage,
wherein the second reference voltage generating circuit comprises:
a reference impedance device connected to first and second terminals; and
an impedance unit connected to the first terminal and a third terminal to which a power voltage is applied,
wherein a voltage of the first terminal, which is formed by adjusting an output impedance of the impedance unit, is provided as the second reference voltage.

7. The analog digital converting device of claim 6, wherein the impedance unit comprises a plurality of impedance devices connected in parallel between the first and third terminals; and
the number of the plurality of impedance devices varies.

8. The analog digital converting device of claim 6, wherein the impedance unit comprises:
a plurality of transistors connected in parallel between the first and third terminals; and
a comparator receiving an initial reference voltage and outputting a voltage to gates of the transistors, the voltage amplified with a difference between a voltage level of the first terminal and a level of the initial reference voltage,
wherein the number of the plurality of transistors varies.

9. The analog digital converting device of claim 8, wherein the second reference voltage generating circuit further comprises a voltage generating circuit generating the initial reference voltage.

10. The analog digital converting device of claim 6, wherein the second reference voltage generating circuit comprises:
a plurality of switch units connected to the third terminal;
transistors connected to the first terminal and the plurality of switch units, respectively; and
a comparator receiving an initial reference voltage and amplifying a difference between a voltage level of the first terminal and a level of the initial reference voltage to output it to gates of the transistors,
wherein the number of transistors connected to the third terminal is determined according to switching operations of the plurality of switch units.

11. An analog digital converting device comprising:
a first reference voltage generating circuit generating a first reference voltage;
a second reference voltage generating circuit generating a second reference voltage;
a first sub analog digital converter receiving an analog input signal and converting the analog input signal into a first digital signal by using the first reference voltage;
an amplifier amplifying a difference between a voltage level of the analog input signal and a voltage level corresponding to the first digital signal to generate a residual voltage; and
a second sub analog digital converter receiving the residual voltage and converting the residual voltage into a second digital signal by using the second reference voltage,
wherein a level of the second reference voltage is increased or decreased according to the second digital signal,
wherein a level of the first reference voltage corresponds to a difference between levels of first and second voltages, and the first sub analog digital converter receives the analog input signal corresponding to an intermediate value between the levels of the first and second voltages.

12. The analog digital converting device of claim 11, wherein the first sub analog digital converter receives an analog input signal having a fixed voltage level.

13. A reference voltage controlling method of an analog digital converting device, the method comprising:
   generating a first digital signal from an analog input signal by using a first reference voltage and amplifying a difference between a voltage of the analog input signal and a voltage level corresponding to the first digital signal to generate a residual signal;
   generating a second digital signal from the residual signal by using a second reference voltage and adjusting the second reference voltage according to the second digital signal; and
   generating a third digital signal from the residual signal by using the adjusted second reference voltage and determining the second reference voltage according to a comparison result of the second and third digital signals.

14. The method of claim 13, wherein the first reference voltage corresponds to a different between levels of a first voltage and a second voltage; and
   a voltage level of the analog input signal has an intermediate value between a level of the first voltage and a level of the second voltage.

15. The method of claim 13, wherein the generating of the residual signal comprises:
   generating a digital analog voltage from the first digital signal by using the first reference voltage; and
   generating the residual signal by amplifying a difference between a voltage level of the analog input signal and the digital analog voltage to have a certain amplification gain.

16. The method of claim 15, wherein the adjusting of the second reference voltage comprises increasing a level of the second reference voltage when the residual signal is amplified greater than the certain amplification gain according to a result with reference to the second digital signal.

17. The method of claim 15, wherein the adjusting of the second reference voltage comprises decreasing a level of the second reference voltage when the residual signal is amplified less than or equal to the certain amplification gain according to a result with reference to the second digital signal.

18. The method of claim 13, wherein the determining of the second reference voltage comprises determining a level of the adjusted second reference voltage as a level of the second reference voltage when values of the second and third digital signals are different.

\* \* \* \* \*